(12) United States Patent
Lin et al.

(10) Patent No.: US 8,128,985 B2
(45) Date of Patent: Mar. 6, 2012

(54) ORGANIC/INORGANIC WHITE LIGHTING DEVICE AND METHOD FOR MAKING THEREOF

(75) Inventors: Ching-Fuh Lin, Taipei (TW); Chun-Yu Lee, Taipei (TW)

(73) Assignee: National Taiwan University, Taipei (TW)

( * ) Notice: Subject to any disclaimer, the term of this patent is extended or adjusted under 35 U.S.C. 154(b) by 294 days.

(21) Appl. No.: 12/575,444

(22) Filed: Oct. 7, 2009

(65) Prior Publication Data
US 2011/0012505 A1    Jan. 20, 2011

(30) Foreign Application Priority Data
Jul. 17, 2009   (TW) ................................ 98124306 A

(51) Int. Cl.
*B05D 5/06* (2006.01)
(52) U.S. Cl. ........................................... 427/66; 427/64
(58) Field of Classification Search ...................... 427/66
See application file for complete search history.

(56) References Cited

U.S. PATENT DOCUMENTS

| 6,777,871 | B2 * | 8/2004 | Duggal et al. | ................ 313/506 |
| 7,294,417 | B2 | 11/2007 | Ren et al. | |
| 7,691,666 | B2 * | 4/2010 | Levy et al. | .................... 438/104 |
| 2007/0034857 | A1 * | 2/2007 | Song | ............................. 257/13 |

FOREIGN PATENT DOCUMENTS
TW    200801263    1/2008
* cited by examiner

*Primary Examiner* — Michael Cleveland
*Assistant Examiner* — Robert Vetere
(74) *Attorney, Agent, or Firm* — Stout, Uxa, Buyan & Mullins, LLP

(57) ABSTRACT

An organic/inorganic white lighting device is disclosed. The organic/inorganic white lighting device includes an anode, an organic/inorganic lighting layer, and a cathode. The organic/inorganic lighting layer is disposed between the anode and the cathode. The organic/inorganic lighting layer includes organic material and an inorganic micro/nano structure of Zinc Oxide (ZnO), wherein the organic material is capable of emitting blue light, the inorganic micro/nano structure of Zinc Oxide is capable of emitting green-yellow light, and the blue light and green-yellow light are mixed for generating white light.

12 Claims, 11 Drawing Sheets

ORGANIC/INORGANIC WHITE LIGHTING DEVICE AND METHOD FOR MAKING THEREOF

CROSS-REFERENCE TO RELATED APPLICATIONS

The entire contents of Taiwan Patent Application No. 098124306, filed Jul. 17, 2009, from which this application claims priority, are incorporated herein by reference. This application is related to U.S. application Ser. No. 12/453,402, filed May 11, 2009, the contents of which are incorporated herein by reference.

BACKGROUND OF THE INVENTION

1. Field of the Invention

The present invention generally relates to a white lighting device, and more particularly to an organic/inorganic white lighting device.

2. Description of the Prior Art

Conventional white light-emitting diodes are divided into two categories: organic white light-emitting diodes and inorganic white light-emitting diodes. A lattice matching requirement needs to be met in the fabrication of inorganic white light-emitting diodes. Additionally, expensive equipment, such as high vacuum or high temperature process instruments, is needed for making inorganic white light-emitting diodes. Thus, the production cost of the inorganic white light-emitting diode remains at a relatively high level. On the other hand, fabrication of the organic white light-emitting diode involves complex and expensive chemical processes. Moreover, the organic white light-emitting diode can be RGB-based OLED, wherein different organic lighting materials for emitting different colors may have different life times or different intensities, which always results in color-shift problems.

For the disadvantages of the prior art mentioned above, there remains a need to provide a novel white lighting device and forming method thereof that are free of high vacuum/high temperature process equipment and complex and expensive chemical processes.

SUMMARY OF THE INVENTION

Accordingly, the present invention provides a novel white lighting device and forming method thereof to overcome the drawbacks of the prior art, and further fulfills other requirements of the industry.

One object of the present invention is to provide a cost-effective white lighting device. The making cost of the white lighting device is low, and without complex and expensive chemical processes.

According to the object, the present invention provides an economical organic/inorganic white lighting device. The organic/inorganic white lighting device includes an anode, an organic/inorganic lighting layer, and a cathode. The organic/inorganic lighting layer is disposed between the anode and the cathode. The organic/inorganic lighting layer includes organic material and inorganic micro/nano structure of Zinc Oxide (ZnO), wherein the organic material is capable of emitting blue light, the inorganic micro/nano structure of Zinc Oxide is capable of emitting green-yellow light, and the blue light and green-yellow light are mixed for generating white light.

An implementation of the present invention provides an organic/inorganic white lighting material, comprising organic material and one or more inorganic micro/nano structures of Zinc Oxide. The organic material is capable of emitting blue light, the inorganic micro/nano structure of Zinc Oxide capable of emitting green-yellow light, and the blue light and green-yellow light are mixed for generating white light.

The present invention also provides a method for making an organic/inorganic white lighting device. The method includes providing an anode; forming an organic layer on the anode; coating a solution on the organic layer and forming a seed layer on the organic layer; forming a micro/nano structure layer of Zinc Oxide on the seed layer, wherein the organic layer is capable of emitting blue light, the micro/nano structure layer of Zinc Oxide is capable of emitting green-yellow light, and the blue light and green-yellow light are mixed for generating white light; and forming a cathode on the micro/nano structure layer of Zinc Oxide.

DETAILED DESCRIPTION OF THE INVENTION

The detailed description of the present invention will be discussed in the following embodiments, which are not intended to limit the scope of the present invention, but can be adapted for other applications. While drawings are illustrated in detail, it is appreciated that the quantity of the disclosed components may be greater or less than that disclosed, except where expressly restricting the amount of the components.

One embodiment of the present invention provides an organic/inorganic white lighting device. The organic/inorganic white lighting device includes an anode, a cathode, and an organic/inorganic lighting layer. The organic/inorganic lighting layer is disposed between the anode and the cathode. The organic/inorganic lighting layer includes organic material and inorganic micro/nano structure of Zinc Oxide (ZnO), wherein the organic material is capable of emitting blue light, the inorganic micro/nano structure of Zinc Oxide is capable of emitting green-yellow light, and the blue light and green-yellow light are mixed for generating white light.

Figure 1A:
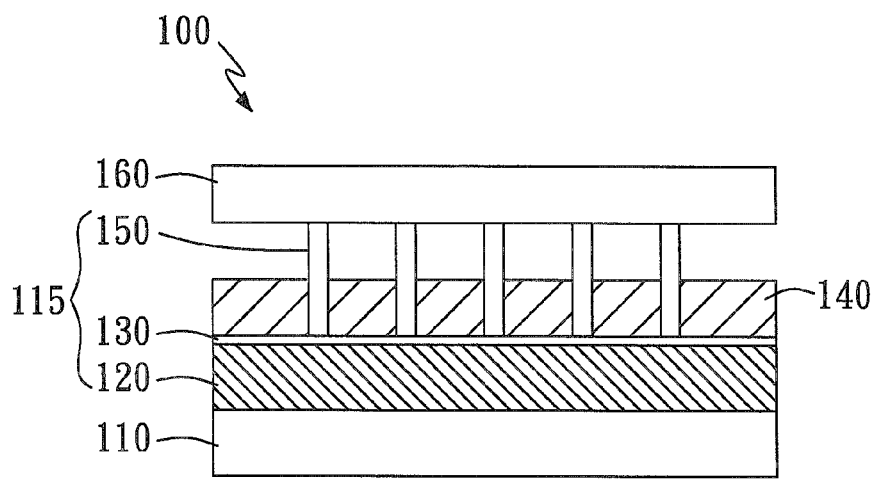
FIG. 1A shows the sectional view of an organic/inorganic white lighting device in accordance with an example of the present embodiment.

FIG. 1A shows the sectional view of an organic/inorganic white lighting device 100 in accordance with an example of the present embodiment. The organic/inorganic white lighting device 100 includes a conductive substrate 110, a cathode 160, and an organic/inorganic lighting layer 115. The conductive substrate 110 is used as an anode. The cathode 160 is disposed over the conductive substrate 110. The organic/inorganic lighting layer 115 is disposed between the cathode 160 and the conductive substrate 110. The organic/inorganic lighting layer 115 includes an organic layer 120, a seed layer 130, and a Zinc Oxide array layer 150 along the direction from the anode to the cathode. The organic layer 120 is covered with the seed layer 130 uniformly. The growth of the Zinc Oxide array layer 150 is induced by the seed layer 130.

Furthermore, an isolation layer 140 can be selectively disposed for providing electrical isolation between each column of the Zinc Oxide array layer 150. The quenching effect which may be caused by the direct contact between the cathode 160 and the organic layer 120 is also prevented by isolation layer 140.

Figure 1B:
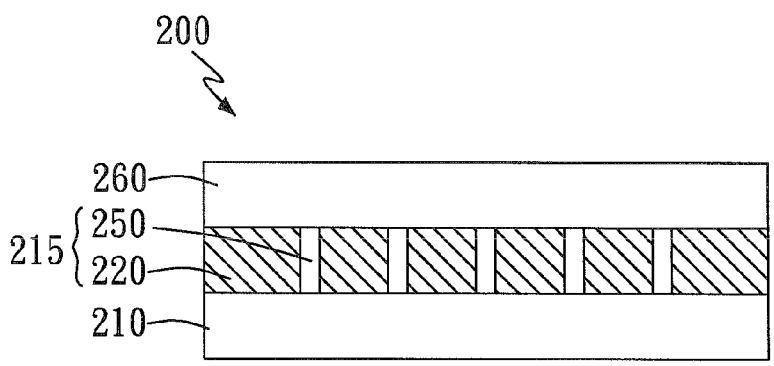
FIG. 1B shows the sectional view of an organic/inorganic white lighting device in accordance with another example of the present embodiment.

FIG. 1B shows the sectional view of an organic/inorganic white lighting device 200 in accordance with another example of the present embodiment. The organic/inorganic white lighting device 200 includes a conductive substrate 210, a cathode 260, and an organic/inorganic lighting layer 215. The conductive substrate 210 is used as an anode. The organic/inorganic lighting layer 215 is disposed between the cathode 260 and the conductive substrate 210. The organic/inorganic lighting layer 215 includes organic material 220 and one or more inorganic micro/nano structures of Zinc Oxide (ZnO) 250, wherein the inorganic micro/nano structures of Zinc Oxide 250 are arranged in an array structure and contact the cathode 260. The organic material 220 is filled within voids of the array structure.

Figure 1C:
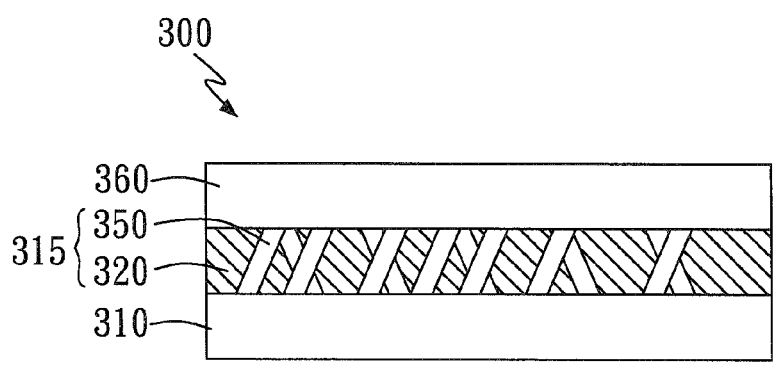
FIG. 1C shows the sectional view of an organic/inorganic white lighting device in accordance with another example of the present embodiment.

Moreover, FIG. 1C shows the sectional view of an organic/inorganic white lighting device 300 in accordance with another example of the present embodiment. The organic/inorganic white lighting device 300 includes a conductive substrate 310, a cathode 360, and an organic/inorganic lighting layer 315. The conductive substrate 310 is used as an anode. The organic/inorganic lighting layer 315 is disposed between the cathode 360 and the conductive substrate 310. The organic/inorganic lighting layer 315 includes organic material 320 and one or more inorganic micro/nano structures of Zinc Oxide (ZnO) 350. The inorganic micro/nano structures of Zinc Oxide 350 are arranged in a stacking structure. The organic material 320 is filled within voids of the stacking structure, parts of the inorganic micro/nano structures of Zinc Oxide 350 contact the cathode 360.

Figure 2:
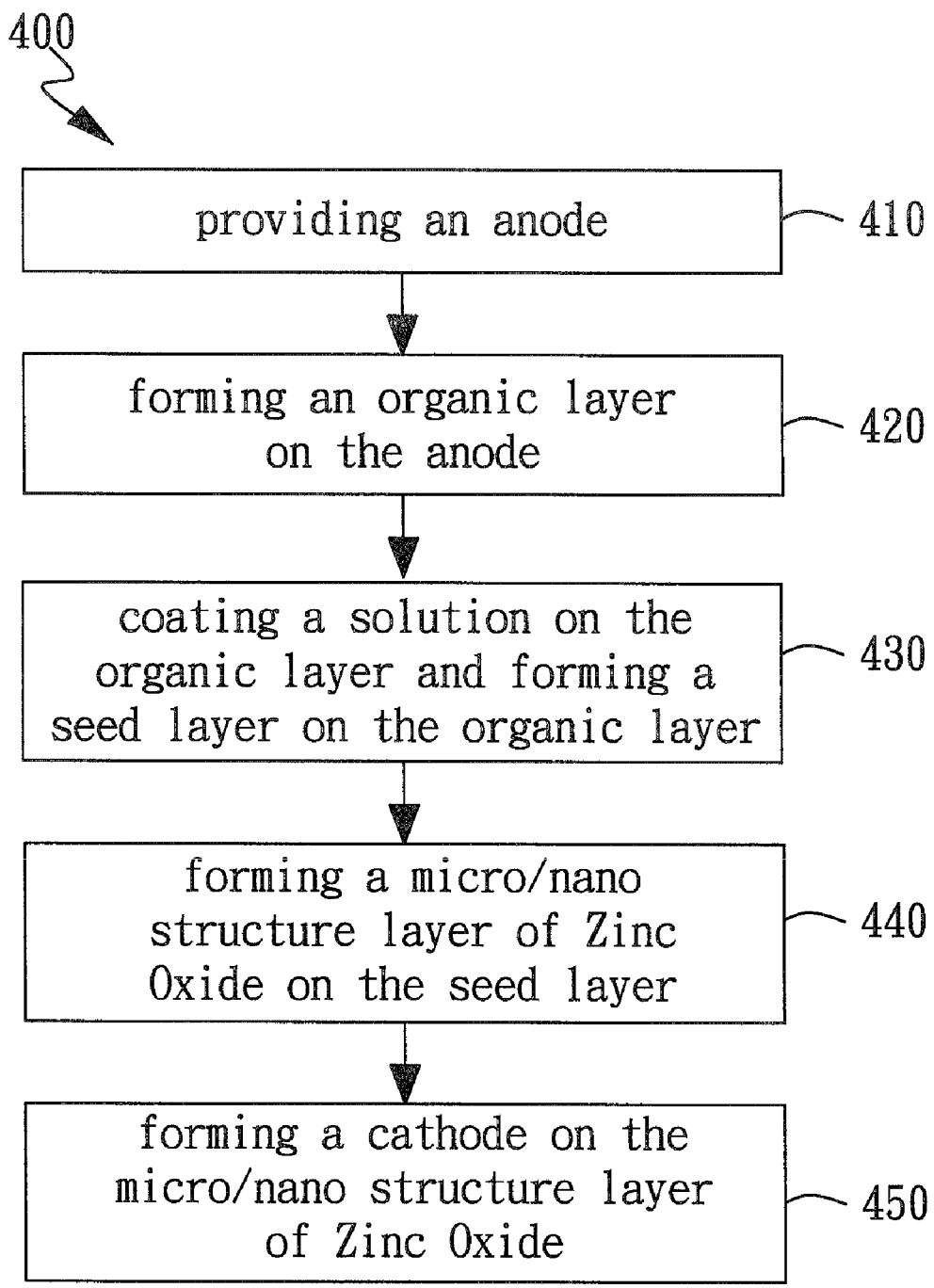
FIG. 2 shows the flow diagram of a method for making an organic/inorganic white lighting device in accordance with an embodiment of the present invention.

FIG. 2 shows the flow diagram of a method 400 for making an organic/inorganic white lighting device in accordance with an embodiment of the present invention. The method 400 includes the following steps: step 410, providing an anode; step 420, forming an organic layer on the anode; step 430, coating a solution on the organic layer and forming a seed layer on the organic layer; step 440, forming a micro/nano structure layer of Zinc Oxide on the seed layer, wherein the organic layer is capable of emitting blue light, the micro/nano structure layer of Zinc Oxide is capable of emitting green-yellow light, and the blue light and green-yellow light are mixed for generating white light; and step 450, forming a cathode on the micro/nano structure layer of Zinc Oxide.

Figure 3A:
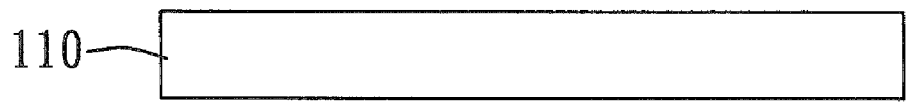
FIGS. 3A-3G show steps for making the organic/inorganic white lighting device.
Figure 3B:
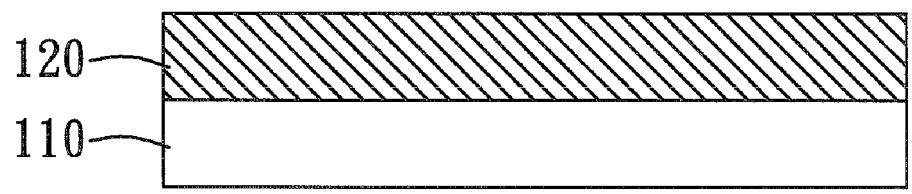

FIGS. 3A-3G show steps for making the organic/inorganic white lighting device 100. Referring to FIG. 3A, provide a conductive substrate 110. The conductive substrate 110 has a conductive layer. The conductive layer can be used as an electrode. The material of the conductive layer can be ITO or other conductive material. Referring to FIG. 3B, form an organic layer 120 on the conductive substrate 110. In this embodiment, an organic layer 120 of PF material is formed on the conductive substrate 110 by spin coating, but is not limited to this. The organic layer 120 can be another material or can be formed by another method. For example, dip coating, jet printing, or thermal evaporation can be used for forming the organic layer 120. The material of the organic layer 120 can be one or more of an organic polymer material and an organic small molecule material. Moreover, the material of the organic layer 120 can be one or more of a fluorescence material and a phosphor material.

Figure 3C:
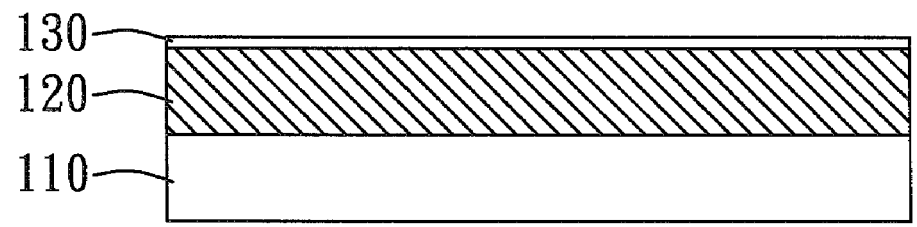

Referring to FIG. 3C, a solution is coated on the organic layer 120 to form a seed layer 130 thereon the organic layer 120. In the illustrated embodiment, a seed layer solution is coated on the organic layer 120 by spin coating for forming the seed layer 130. The seed layer solution can include, for example, zinc acetate dehydrate, monoethanolamine, isopropanol (IPA), and nanoparticles of Zinc Oxide. The monoethanolamine component is used as stabilizer. The diameters of the Zinc Oxide nanoparticles can be about 10-50 nm. According to this embodiment, the seed layer solution can include 5.49 grams of zinc acetate dehydrate, 1.5 grams of monoethanolamine, 50 ml of IPA, and 1.3 grams of Zinc Oxide nanoparticles having diameters of about 20 nm.

IPA is one of the few solvents which is compatible with and does not dissolve the organic layer 120. IPA allows the seed layer solution to have a good uniformity during spin coating. The addition of the Zinc Oxide nanoparticles is capable of improving the adsorbability of the seed layer 130 on the organic layer 120. Additionally, the seed layer solution is preheated before spin coating. The temperature of the preheating is about 110-130° C., such as 120° C., so as to decrease the surface tension of the seed layer solution and make the organic layer 120 be covered by the seed layer solution uniformly.

Figure 3D:
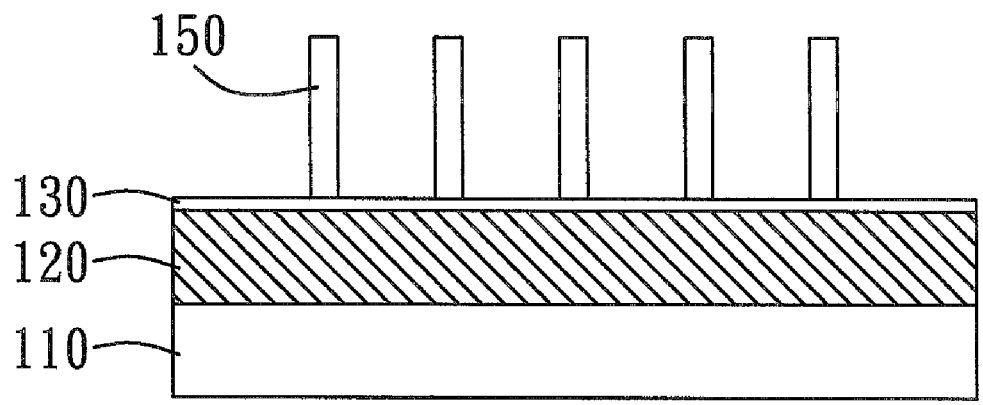

Referring to FIG. 3D, a micro/nano structure layer of Zinc Oxide 150 is formed on the seed layer 130. In this embodiment, the sample is disposed within an aqueous solution at low temperature of 90° C. for three hours and the micro/nano structure layer of Zinc Oxide 150 is formed by a hydrothermal method. The aqueous solution includes zinc nitrate hexahydrate and hexamethylenetetramine. According to this embodiment, the aqueous solution can include 15 grams of zinc nitrate hexahydrate, 7.5 grams of hexamethylenetetramine, and 1000 ml of deionized water.

Although the micro/nano structure layer of Zinc Oxide 150 is formed by a hydrothermal method in this embodiment, the method for forming the micro/nano structure layer of Zinc Oxide 150 is not limited to such. The method for forming the micro/nano structure layer of Zinc Oxide can comprise one or more of spin coating, dip coating, an electrochemical method, thermal evaporation, chemical vapor deposition, molecular beam epitaxy, or a porous anodic aluminum oxide template method (AAO). Moreover, the micro/nano structure layer of Zinc Oxide 150 includes Zinc Oxide nanorod array, but is not limited to this; the inorganic micro/nano structure of Zinc Oxide 150 can also be or comprise one or more of nanoparticle, nanocluster, and nanofilm.

Figure 3E:
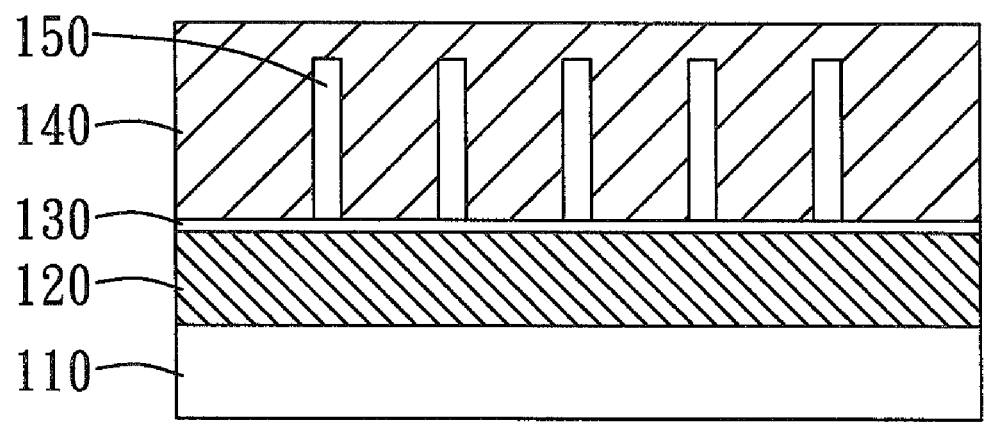

Referring to FIG. 3E, an isolation layer 140 is formed for covering the micro/nano structure layer of Zinc Oxide 150 and the seed layer 130. The isolation layer 140 can provide electrical isolation between each column of the Zinc Oxide array layer 150. According to this embodiment, the material of the isolation layer 140 is a polysiloxane-based dielectric material (SOG), but is not limited to this. The material of the isolation layer 140 can be another isolation material.

Figure 3F:
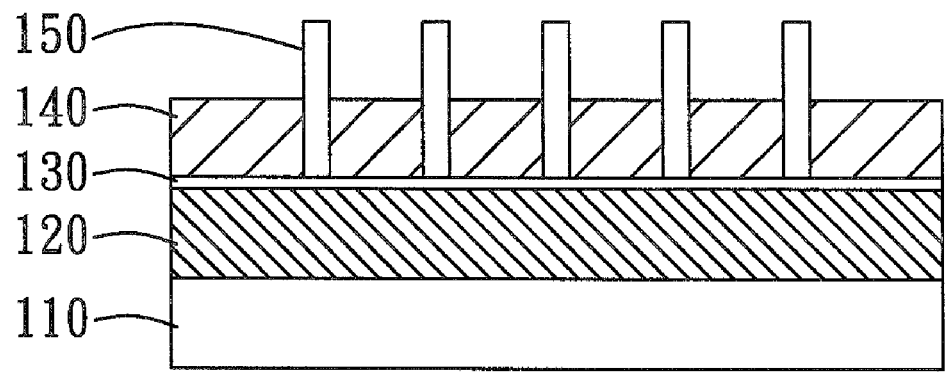

Referring to FIG. 3F, part of the isolation layer 140 is removed thus exposing the tips of the micro/nano structure layer of Zinc Oxide 150. In this embodiment, the isolation layer 140 is etched by an oxygen plasma treatment, so as to reduce the thickness of the isolation layer 140 below that of the tips of the micro/nano structure layer of Zinc Oxide 150. Besides or in addition to an oxygen plasma treatment, the isolation layer 140 can be etched using one or more other etching processes. Following the oxygen plasma treatment, the sample is annealed at 120° C. for two hours to remove the solvent.

Figure 3G:
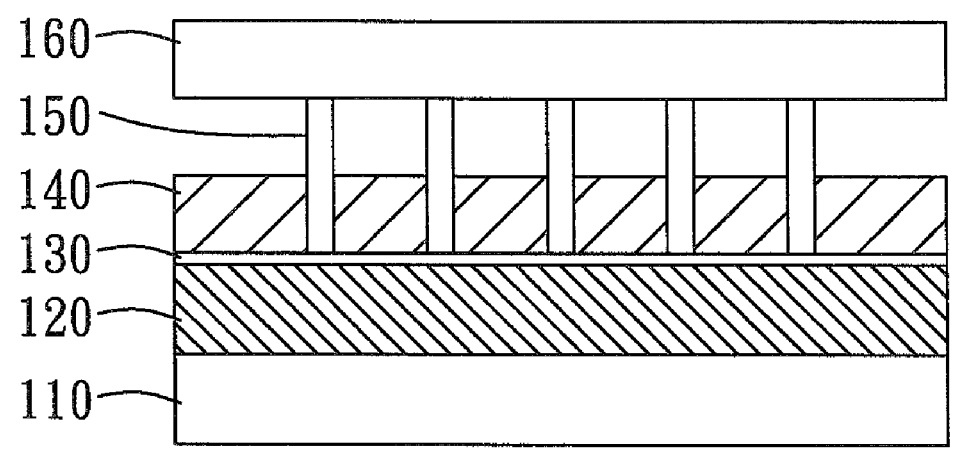

Finally, referring to FIG. 3G, a cathode 160 is formed. The cathode 160 is connected with the tips of the micro/nano structure layer of Zinc Oxide 150. In this embodiment, an aluminum electrode is formed by thermal evaporation. The thickness of the electrode is about 200 nm. It is noted that the isolation layer 140 can provide electrical isolation between the cathode 160 and the organic layer 120. By way of the steps mentioned above, the organic/inorganic white lighting device 100 shown in FIG. 1A thus can be formed.

Figure 4A:
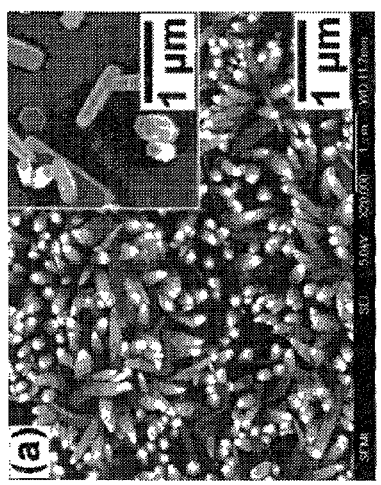
FIGS. 4A-4F show images of the micro/nano structure layer of Zinc Oxide obtained using a field-emission scanning electron microscope (FESEM)
Figure 4B:
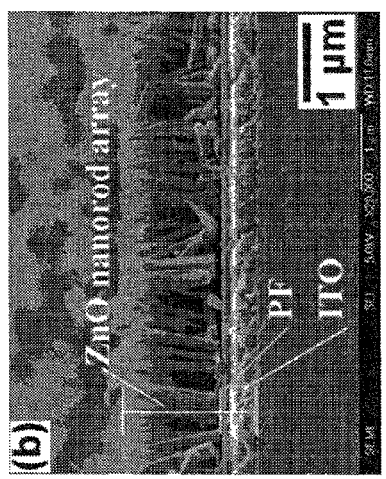

FIGS. 4A-4F show images of the micro/nano structure layer of Zinc Oxide 150 obtained by using a field-emission scanning electron microscope (FESEM). FIG. 4A and FIG. 4B show top-view and cross-sectional images of the micro/nano structure layer of Zinc Oxide 150 respectively. The micro/nano structure layer of Zinc Oxide 150 includes ZnO nanorod array. The ZnO nanorods are dense and substantially vertical to the organic layer 120 of PF material, wherein the average diameter of the ZnO nanorods is about 120 nm, the average length of the ZnO nanorods is about 1.25 um, and the thickness of the organic layer 120 of PF material is about 90 nm.

In contrast, the right top corner of FIG. 4A shows ZnO nanorods which are formed by another seed layer solution including zinc acetate dehydrate, monoethanolamine, and 2-methoxyethanol. The ZnO nanorods are thin and irregularly formed on the organic layer 120 of PF material. One can conclude from this fact that the growth of the ZnO nanorods depends strongly on the formula of the seed layer solution.

Figure 4C:
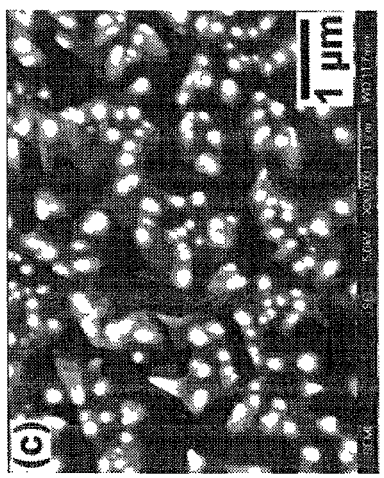
Figure 4F:
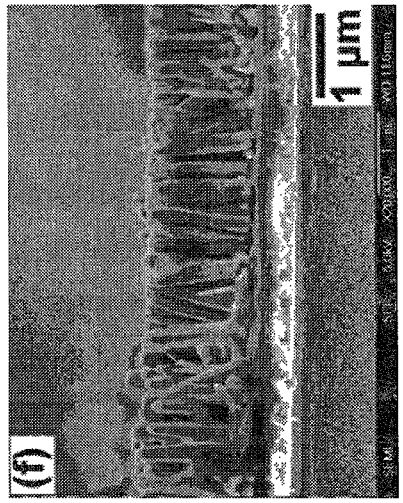
Figure 4E:
Figure 4D:
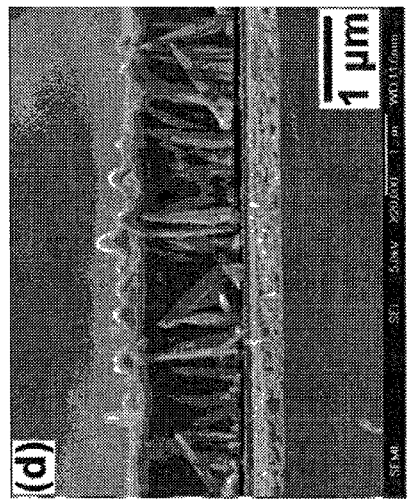

FIG. 4C and FIG. 4D show top-view and cross-sectional images of the isolation layer 140 which covers the micro/nano structure layer of Zinc Oxide 150 and the seed layer 130 respectively. The spaces between ZnO nanorods are fully filled with the isolation layer 140, which can provide electrical isolation between the nanorods of the Zinc Oxide array layer 150. FIG. 4E and FIG. 4F show top-view and cross-sectional images of the sample following an oxygen plasma treatment. As shown in the images, the ZnO nanorods are still dense and substantially vertical to the organic layer 120.

Figure 5:
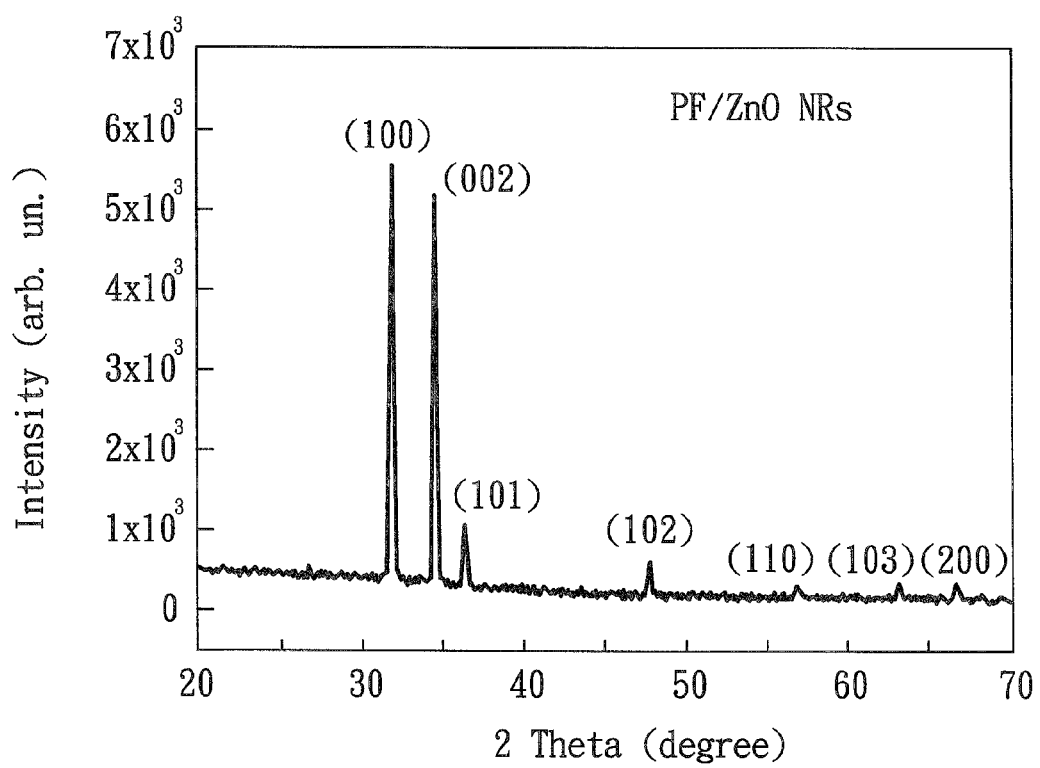
FIG. 5 shows the X-ray diffraction pattern of the micro/nano structure layer of Zinc Oxide.

FIG. 5 shows the X-ray diffraction pattern of the micro/nano structure layer of Zinc Oxide 150. As shown in FIG. 5, several diffraction peaks can be observed at $2\theta=31.74°$, $34.44°$, $36.26°$, $47.48°$, $56.66°$ and $62.93°$, which are due to ZnO (100), (002), (101), (102), (110) and (103), respectively. All of these peaks match the wurtzite ZnO structure. The growth direction of the ZnO nanorods of the micro/nano structure layer of Zinc Oxide 150 is not only vertical to the seed layer 130 but also has a plurality of growth directions.

Figure 6:
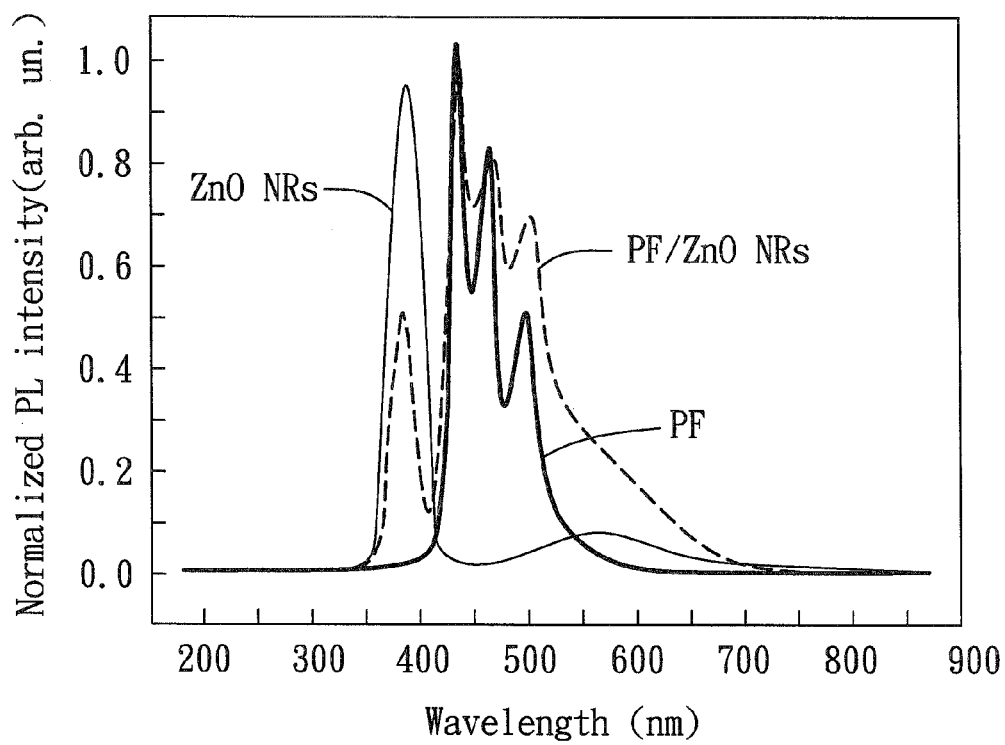
FIG. 6 shows the normalized photoluminescence (PL) spectra of the organic/inorganic white lighting device.

FIG. 6 shows the normalized photoluminescence (PL) spectra of the organic/inorganic white lighting device 100. The PL spectrum of the organic/inorganic white lighting device 100 can be clearly identified by a blue emission of the organic layer 120 of PF material, green-yellow emission band at 567 nm emission of ZnO nanorods, and an UV emission band at 380 nm of ZnO nanorods.

Figure 7:
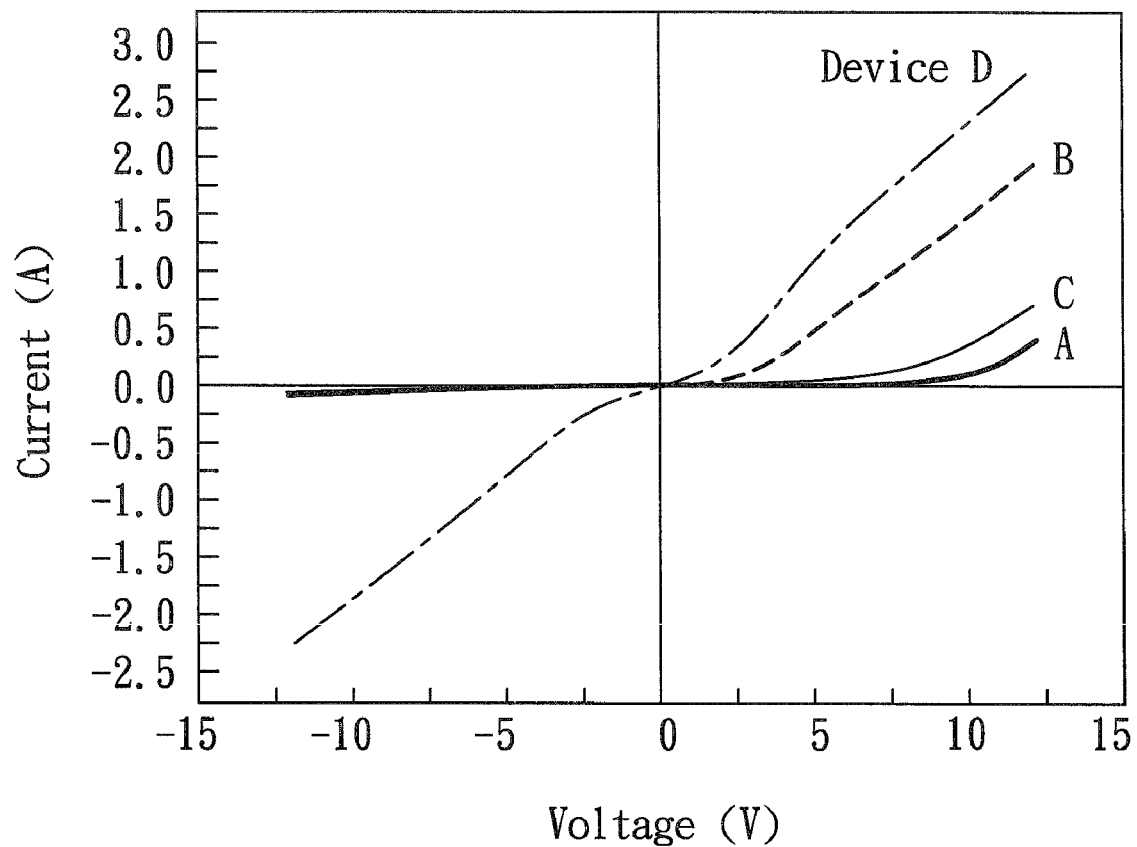
FIG. 7 shows the current-voltage characteristics of the different lighting devices.

FIG. 7 shows the current-voltage characteristics of the different lighting devices. The different lighting devices have different structures. The lighting device A only has the organic layer 120 of PF material between the conductive substrate and the aluminum electrode. The lighting device B has the organic layer 120 of PF material (thickness is 90 nm) and the ZnO nanorods array between the conductive substrate and the aluminum electrode. The lighting device C has the organic layer 120 of PF material (thickness is 240 nm) and the ZnO nanorods array between the conductive substrate and the aluminum electrode. The lighting device D only has the ZnO nanorods array between the conductive substrate and the aluminum electrode.

The current-voltage curves of lighting devices A, B, and C demonstrate a stable behavior. The curve of lighting device D indicates that the ZnO nanorods directly contact the conductive substrate leading to the large current leakage. Moreover, the devices B, C, and D having ZnO nanorods arrays show higher current density at the same voltage than the device A without the ZnO nanorods array. Because the thickness of the organic layer of device C is thicker than the thickness of the organic layer of device B, the current density of device C is lower than that of device B. Thus, the thickness of the organic layer of the present invention is controlled to be less than or equal to 150 nm, preferably less than or equal to 100 nm.

The thickness control parameters are used for the white lighting device whose organic/inorganic lighting layer is a multi-layer structure. The mobility of carriers in the organic layer is much lower than the mobility of carriers in the ZnO nanorods. For example, when the thickness of the organic layer is about 100 nm (less than 150 nm) and the length of the ZnO nanorods is more than 1 um, the recombination of holes and electrons occurs easily on the interface between the inorganic ZnO nanorods and the organic lighting material, so as to make the ZnO nanorods and organic lighting material emit lights at the same time. When the thickness of the organic layer is more than 200 nm, the recombination zone of holes and electrons is restricted to the organic layer. Therefore, the light emitted only corresponds to the emission of the organic layer. In other words, when the thickness of the organic layer is too thick, the color of the light emitted from the device is almost defined by the organic layer.

Figure 8A:
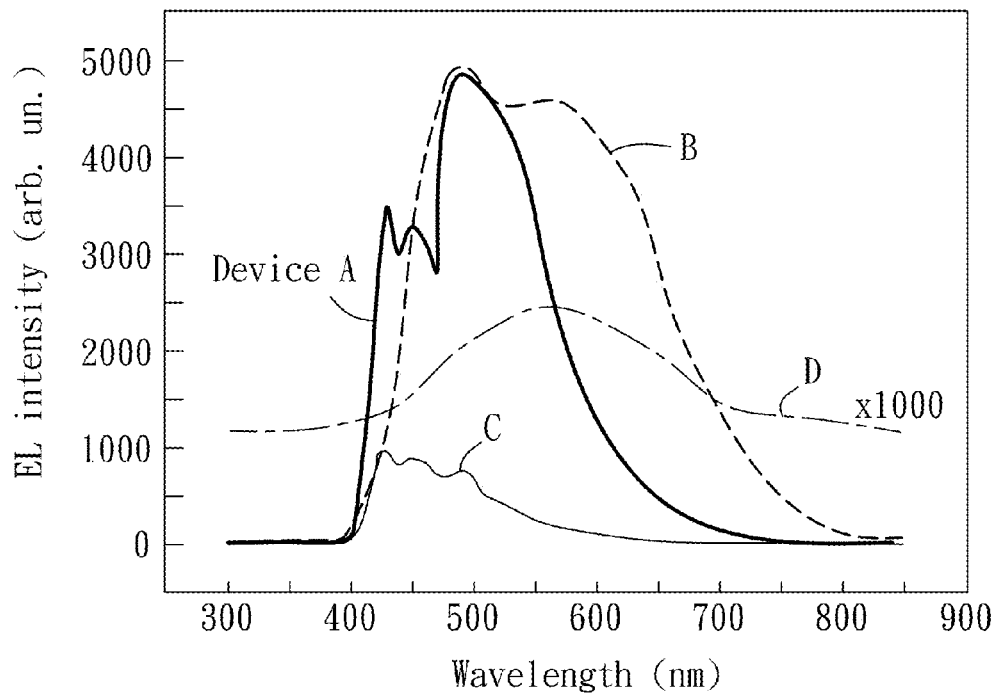
FIG. 8A shows the electroluminescence spectra of the different lighting devices.

FIG. 8A shows the electroluminescence spectra of the different lighting devices. The same dc bias of 10V is applied to the lighting devices A, B, C, and D. Device B has a white-light emission consisting of a broad green-yellow emission centered at 567 nm and a blue emission at 489 nm. Device A has a blue emission resulting from the PF-related emission; Device D has a green-yellow emission resulting from the ZnO nanorods array. The comparison of device B with devices A and D reveals that the broad green-yellow band comes from surface defects of ZnO nanorods, while the blue band results from the PF-related emission. It is noted that the brightness of device B is more than 1000 times that of the brightness of device D. When 10V is applied to device B, the brightness of device B is more than 100 nits.

Figure 8B:
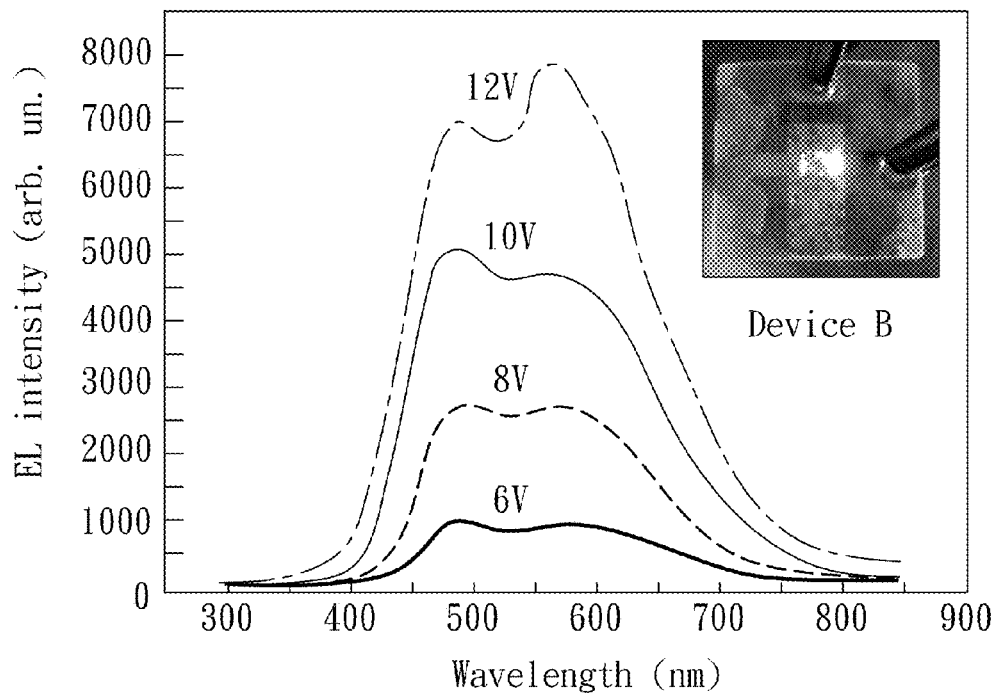
FIG. 8B shows the electroluminescence spectra of the same lighting device under different voltages.

FIG. 8B shows the electroluminescence spectra of the same lighting device under different voltages. When a voltage from 6 to 10 V is applied to device B, device B has a white-light emission consisting of a broad green-yellow emission centered at 567 nm and a blue emission at 489 nm without exhibiting spectrum shift. When a voltage of 12V is applied to device B, the emission at the green-yellow band increases more than the blue band because of more excitation to the ZnO nanorods.

Figure 9:
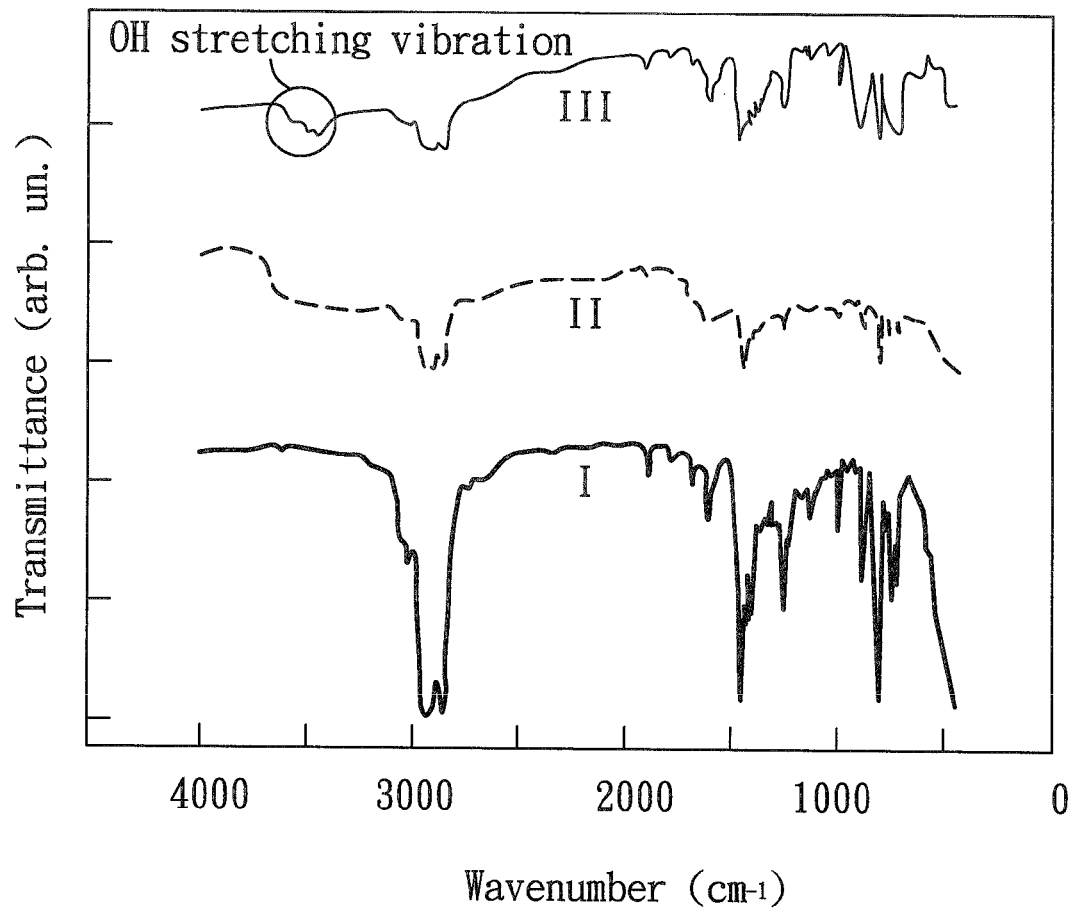
FIG. 9 shows the Fourier transform infrared spectroscopy (FTIR) of the different lighting devices.

FIG. 9 shows the Fourier transform infrared spectroscopy (FTIR) of the different lighting devices. Spectrum I is the Fourier transform infrared spectroscopy of the organic layer 120 of PF material. Spectrum II is the Fourier transform infrared spectroscopy of the organic layer 120 of PF material and the seed layer 130 (i.e., ZnO seed layer). Spectrum III is the Fourier transform infrared spectroscopy of the organic layer 120 of PF material, the seed layer 130, and the micro/nano structure layer of Zinc Oxide 150.

Spectrum I has absorption peaks at 2953, 2926, 2855, 1460, 1402, 1377, 1253, 1123, 813 $cm^{-1}$. Compared to spectrum I, spectrum II has similar absorption peaks, wherein some absorption peaks are shifted. It is noted that spectrum II has the appearance of a new shoulder at 3400-3600 $cm^{-1}$ of the OH stretching band, showing the formation of a new phase on the interface between the seed layer 130 and the organic layer 120 of PF material.

Spectrum III has three new characteristic peaks appearing at 3441, 3502, and 3574 $cm^{-1}$, which are assigned to the OH stretching band. The results confirm the presence of OH groups on the interface between ZnO nanorods and the organic layer 120 of PF material.

The present invention provides for the micro/nano structure layer of Zinc Oxide 150 to be formed on the organic layer 120 of PF material by hydrothermal deposition. The organic lighting material and the inorganic lighting material are combined successfully. The organic lighting material is capable of emitting blue light; the inorganic lighting material is capable of emitting green-yellow light; the blue light and green-yellow light are mixed for generating white light. During the growth process of the micro/nano structure layer of Zinc Oxide 150, $Zn(OH)_2$ is formed on the ZnO nanorods and on the interface between the inorganic ZnO nanorods and the organic lighting material. The $Zn(OH)_2$ is able to enhance the surface defect of the inorganic ZnO nanorods. When the voltage is applied to the device, the recombination of holes and electrons occurs easily on the surface defect of the inorganic ZnO nanorods or on the interface between the inorganic ZnO nanorods and the organic lighting material.

Although specific embodiments have been illustrated and described, it will be appreciated by those skilled in the art that various modifications may be made without departing from the scope of the present invention, which is intended to be limited solely by the appended claims.

What is claimed is:

1. A method for making an organic/inorganic white lighting device, comprising:
   providing an anode;
   forming an organic layer on said anode;
   coating a solution on said organic layer and forming a seed layer on said organic layer;
   forming a micro/nano structure layer of Zinc Oxide on said seed layer, wherein said organic layer is capable of emitting blue light, said micro/nano structure layer of Zinc Oxide is capable of emitting green-yellow light, and said blue light and green-yellow light are mixed for generating white light; and
   forming a cathode on said micro/nano structure layer of Zinc Oxide.

2. The method for making an organic/inorganic white lighting device according to claim 1, wherein the method for forming said organic layer comprises one or more of spin coating, dip coating, jet printing, and thermal evaporation.

3. The method for making an organic/inorganic white lighting device according to claim 1, wherein the method for forming said micro/nano structure layer of Zinc Oxide comprises one or more of hydrothermal, spin coating, dip coating, an electrochemical method, thermal evaporation, chemical vapor deposition, molecular beam epitaxy, and a porous anodic aluminum oxide template method (AAO).

4. The method for making an organic/inorganic white lighting device according to claim 1, wherein said solution comprises zinc acetate dehydrate, monoethanolamine, isopropanol, and nanoparticles of Zinc Oxide.

5. The method for making an organic/inorganic white lighting device according to claim 4, wherein a heating process is performed before coating said solution on said organic layer so as to cause said organic layer to be uniformly covered by said solution.

6. The method for making an organic/inorganic white lighting device according to claim 5, wherein the temperature of said heating process is about 110-130° C.

7. The method for making an organic/inorganic white lighting device according to claim 1, wherein diameters of said Zinc Oxide nanoparticles are about 10-50 nm.

8. The method for making an organic/inorganic white lighting device according to claim 1, wherein said organic material is one or more of an organic polymer material and an organic small molecule material.

9. The method for making an organic/inorganic white lighting device according to claim 1, wherein said organic material is one or more of a fluorescence material and a phosphor material.

10. The method for making an organic/inorganic white lighting device according to claim 1, wherein said inorganic micro/nano structure of Zinc Oxide comprises one or more of nanoparticle, nanorod, nanocluster, and nanofilm.

11. The method for making an organic/inorganic white lighting device according to claim 1, wherein the thickness of said organic layer is less than or equal to 150 nm.

12. The method for making an organic/inorganic white lighting device according to claim 1, wherein the thickness of said organic layer is less than or equal to 100 nm.

* * * * *